United States Patent [19]

Yamabe et al.

[11] Patent Number: 4,735,824
[45] Date of Patent: Apr. 5, 1988

[54] METHOD OF MANUFACTURING AN MOS CAPACITOR

[75] Inventors: Kikuo Yamabe; Keitaro Imai, both of Yokohama, Japan

[73] Assignee: Kabushiki Kaisha Toshiba, Kawasaki, Japan

[21] Appl. No.: 866,310

[22] Filed: May 23, 1986

[30] Foreign Application Priority Data

May 31, 1985 [JP] Japan .................. 60-116384
May 31, 1985 [JP] Japan .................. 60-118101
Jan. 10, 1986 [JP] Japan .................. 61-3104
Jan. 21, 1986 [JP] Japan .................. 61-8959

[51] Int. Cl.$^4$ .............................................. B05D 5/12
[52] U.S. Cl. ........................................ 427/79; 427/80
[58] Field of Search ........................... 427/80, 79, 86

[56] References Cited

U.S. PATENT DOCUMENTS

| | | | |
|---|---|---|---|
| 3,947,299 | 3/1976 | Weijland | 148/187 |
| 4,139,785 | 2/1979 | McElroy | 307/238 |
| 4,234,362 | 11/1980 | Riseman | 148/187 |
| 4,621,277 | 11/1986 | Ito | 357/54 |
| 4,645,564 | 2/1987 | Moire | 156/662 |

FOREIGN PATENT DOCUMENTS 55-83268  6/1980  Japan ................................ 427/86
60-111436 6/1985  Japan .

OTHER PUBLICATIONS

S. A. Abbas, "Silicon on Polysilicon with Deep Dielectric Isolation", IBM Technical Disclosure Bulletin, vol. 22, No. 7, Dec. 1979, pp. 2754–2755.

B. E. Deal, D. W. Hess, J. D. Plummer, C. P. Ho, "Kinetics of the Thermal Oxidation of Silicon in $O_2/H_2O$ and $O_2/Cl_2$ Mixtures", J. Electrochem. Soc., vol. 125, No. 2, Feb. 1978, pp. 339–346.

IEEE Transactions on Electron Devices, vol. ED-32, No. 2: H. Sunami et al, "Scaling Considerations and Dielectric Breakdown Improvement of a Corrugated Capacitor Cell for a Furture dRAM", pp. 296–303, 1985.

Primary Examiner—Shrive P. Beck
Assistant Examiner—Vi Duong Dang
Attorney, Agent, or Firm—Oblon, Fisher, Spivak, McClelland & Maier

[57] ABSTRACT

A method of forming an MOS capacitor by the steps of cutting a groove in the surface of a silicon substrate by the RIE process, thermally oxidizing the surface of said silicon substrate, depositing a capacitor electrode on said capacitor-insulating layer, being characterized in that when the capacitor-insulating layer is deposited, the surface of the silicon substrate is thermally oxidized in an oxidizing atmosphere containing 15% by vol. of steam.

14 Claims, 7 Drawing Sheets

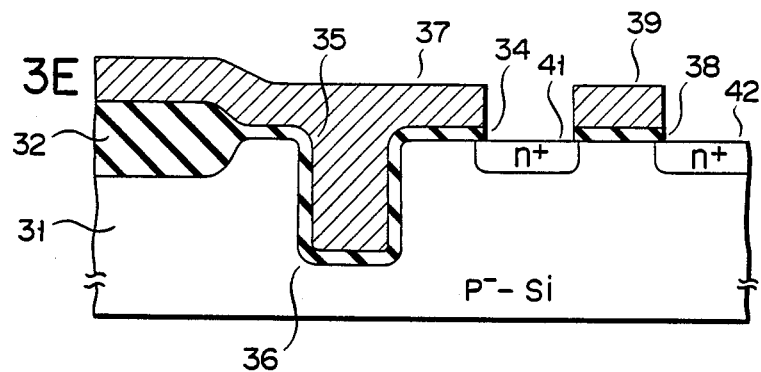
F I G. 3E
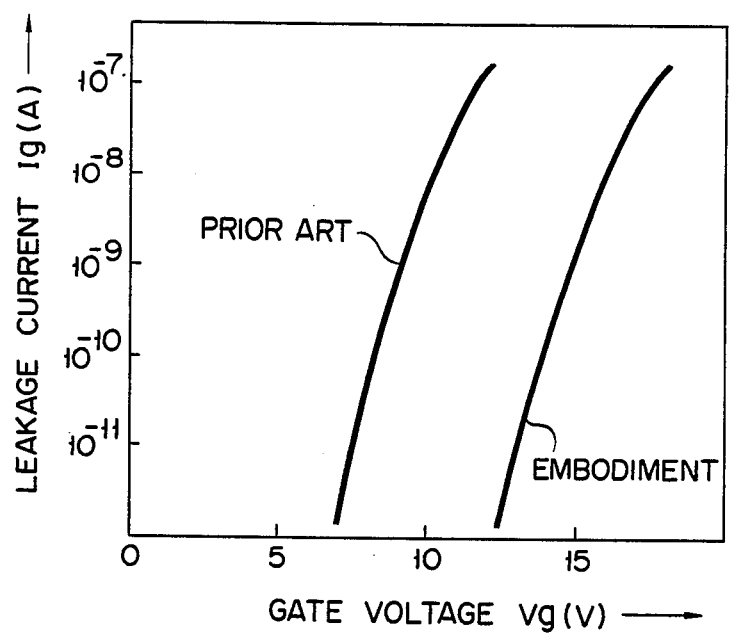
F I G. 4

F I G. 5A
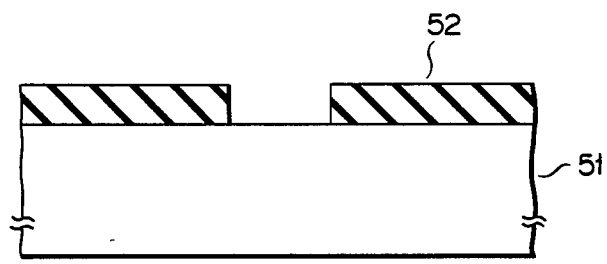
F I G. 5B
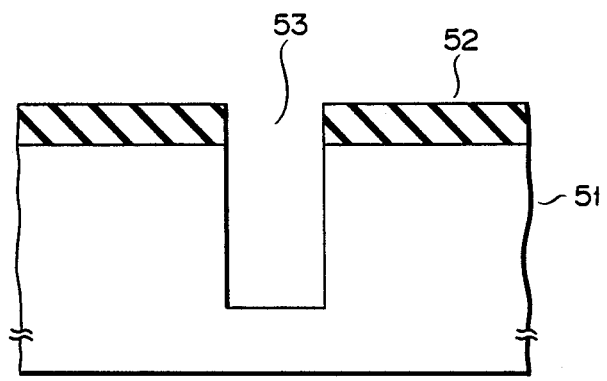
F I G. 5C
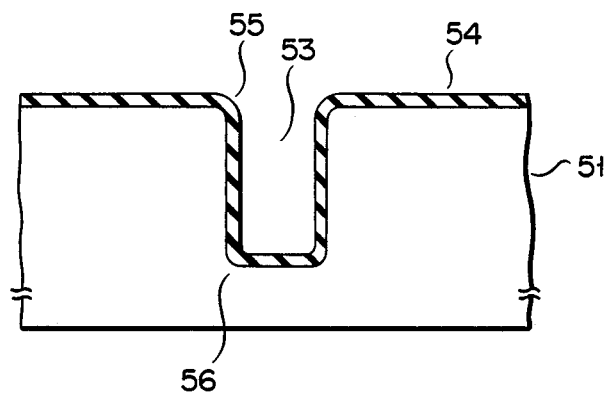

F I G. 5D
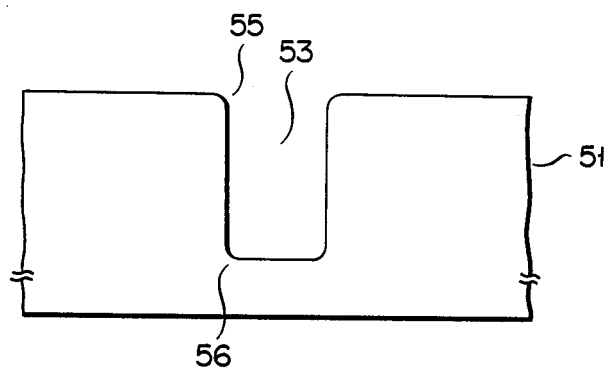
F I G. 5E
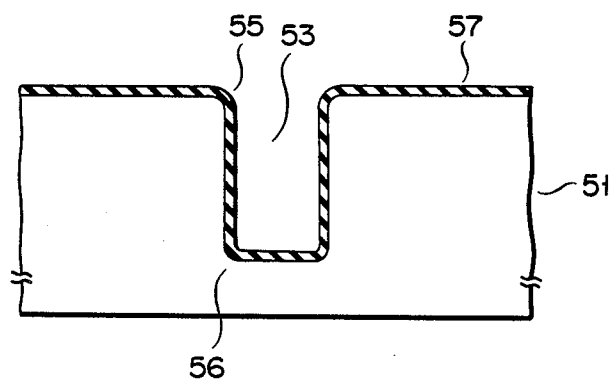
F I G. 5F
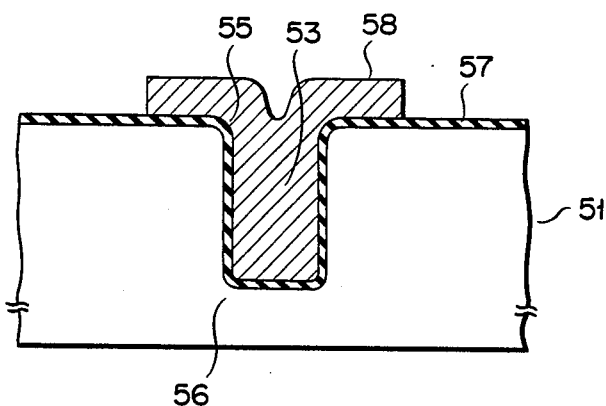

METHOD OF MANUFACTURING AN MOS CAPACITOR

BACKGROUND OF THE INVENTION

This invention relates to a method of manufacturing a capacitor, and more particularly to a method of forming an MOS capacitor in a groove cut in a semiconductor substrate.

In recent years, miniaturization and high integration based on the scaling method are being developed for an MOS dynamic memory (hereinafter abbreviated as "dRAM"). An MOS capacitor, a constituent of dRAM, follows the same pattern of development. Therefore, research is being made for the reduction of thickness $t_{ox}$ and area S of a gate oxide layer involved in said MOS capacitor. Now let it be assumed that $\alpha$ represents a scaling coefficient. Then, the thickness of the gate oxide layer is indicated as $t_{ox}/\alpha$ and the area thereof as $S/\alpha^2$. Assuming that the dielectric constant is denoted by $\epsilon$, then capacity C of the MOS capacitor is given as $C = \epsilon S/t_{ox}$. After said scaling, therefore, capacity C' of said MOS capacitor is reduced to $1/\alpha$ as can be inferred from formula $C' = C/\alpha$.

When the MOS capacitor is reduced in capacity, the drawback arises that the scattering of alpha rays gives rise to the tendency toward the more frequent appearance of soft errors. Further, the smaller the capacity of the MOS capacitor, the more reduced a ratio between said capacity and that of bit rays, leading to a decline in a sense margin and consequently the more prominent tendency toward the appearance of malfunctions. Generally, therefore, the area of the MOS capacitor is reduced to an extent of $S/\alpha$ instead of $S/\alpha^2$. Since, however, the dimension of the MOS capacitor area is reduced year after year, the manufacture of a highly reliable dRAM is approaching a limit.

To date, the application of an insulation layer of, for example, $Ta_2O_5$ having a large dielectric constant has been proposed as means for increasing the capacity of the MOS capacitor, and yet this process is not put to practical application. On the other hand, research is being continued for the process of preparing a capacitor insulation layer from a highly reliable silicon oxide layer having an extremely small thickness of less than 10 [nm]. But this process is found incapable of practical use, because it is necessary to provide demineralized water of extremely high purity and chemicals and moreover build a clean room possessed of tremendously high purity.

Therefore, the recent method of increasing the capacity of the MOS capacitor consists in cutting a groove in the surface of a silicon substrate, to a sufficient depth to substantially increase the total capacity area without expanding the opening of said groove. When, however, such groove is formed by an anisotropic dry etching such as reactive ion etching (RIE), the undermentioned difficulties arise. Namely, the groove formed by this etching has its side walls rendered perpendicular, thereby causing the corners (angular portions) of the top or bottom portions of the groove to have an extremely small curvature radius. When, therefore, a gate oxide layer is deposited on the surface of a silicon substrate by thermal oxidation, the oxide layer deposited in the above-mentioned angular portions of the groove will have a thinner wall than the oxide layer formed on the flat portion of the groove. This phenomenon is explained as follows. When a silicon layer is oxidized, the volume of the resultant silicon layer will have a volume about 2.3 times the original silicon layer. When, therefore, oxidation proceeds, that side of an interface between Si and $SiO_2$ which faces the oxidized layer undergoes compression stresses, which are concentrated in the aforementioned angular portions of the groove, thereby presumably suppressing oxidation.

When an oxidized layer deposited on the top or bottom angular portion is made thinner than the oxidized layer formed in the flat portion of the groove, its withstand voltage will decrease, causing a large leak current flow through an electric field even if it happens to have a low voltage level. Moreover, an electric field tends to be concentrated in the vertically extending angular section of the aforementioned groove. In the concentrated electric filed, therefore, Fowler-Nordhein current prominently increases to deteriorate the insulating property of the oxide layer. Conversely, if a capacitor insulation layer is made thick in order to sufficiently reduce a leak current with respect to the voltage actually applied, it will inevitably grow too thick in the flat portion of the groove. This event will inevitably offset the expected capacity increase which might otherwise to realized by the boring of a groove for the intended enlargement of the capacitor area.

SUMMARY OF THE INVENTION

It is accordingly the object of this invention to provide a method of manufacturing a capacitor which enables a capacitor insulation layer to be uniformly deposited on the surface of a silicon substrate provided with a groove, reduces a leak current appearing in the angular portion of the groove, thereby ensuring the improved reliability of a capacitor.

The above-mentioned object of the present invention is attained through the under mentioned steps. First, a groove is cut in the surface of a silicon substrate. Thereafter, the surface of said silicon substrate is thermally oxidized in an oxidizing atmosphere containing at least one of the group consisting of steam, chlorine and flourine (when steam is contained, its proportion is preferred to account for 10 ppm to 30% by volume; when chlorine and/or fluorine is contained, the proportion is defined to be 20 ppm to 10% by vol.) to deposit a capacitor insulation layer on the silicon substrate surface. Then a capacitor electrode is mounted on said capacitor insulation layer.

The reason is as follows why the content of, for example, steam is limited to the above-mentioned level. If the steam content increases over 30% by vol, oxidation will be too much accelerated, failing to deposit an oxidizing layer under well controlled conditions. Conversely, if the steam content falls below 10 ppm, it will be impossible to realize the effect of sufficiently giving rise to viscous fluidity at the time of oxidation. Therefore, the steam content is preferred to range from 0.1 to 10% by vol. Further, the reason is as follows why the content of chlorine gas and/or fluorine gas is limited to the aforementioned level. If the content of either gas rises above 10% by vol, the silicon will tend to be etched, giving rise to the appearance of pits. Conversely if the gas content decreases from 20 ppm, it will be impossible to fully realize the effect of viscous fluidity at the time of oxidation. Therefore, the content of chlorine and/or fluorine gas is preferred to range between 0.1 and 5% by vol.

The capacitor-manufacturing method embodying this invention comprises the steps of:

forming a groove in the surface of the silicon substrate;

thermally oxidizing said surface in an oxidizing atmosphere containing at least one of the groups consisting of steam, chlorine or fluorine (the steam percentage is desired to range between 10 ppm to 30% by vol; and the percentage of chlorine and/or fluorine is preferred to range from 20 ppm to 10% by vol) to mount an oxidized layer on said surface;

removing said thermally oxidized layer;

depositing a capacitor-insulating layer on the surface of the silicon substrate; and forming a capacitor electrode on said capacitor insulating layer.

BRIEF DESCRIPTION OF THE DRAWINGS

FIGS. 3A to 3E are cross sectional views showing the sequential steps of manufacturing an MOS capacitor by a method according to a first embodiment of this invention;

FIG. 4 is a curve diagram showing the characteristic of a leak current flowing through a gate oxide layer;

FIGS. 5A to 5F are cross sectional views illustrating the sequential steps of manufacturing an MOS capacitor by a method according to a second embodiment of the invention.

DETAILED DESCRIPTION OF THE PREFERRED EMBODIMENTS

Description may now be made of the principle on which the present invention is based, before references are made the respective embodiments of the invention.

The fundamental feature of the invention lies in the steps of selecting an atmosphere in which the surface of a silicon substrate is thermally oxidized, thereby minimizing the concentration of stresses in the angular portions of a groove cut in the silicon substrate surface, allowing the curvature radius of the angular portions to be enlarged, and preventing the thickness of an oxidized layer from being reduced.

Figure 1A:
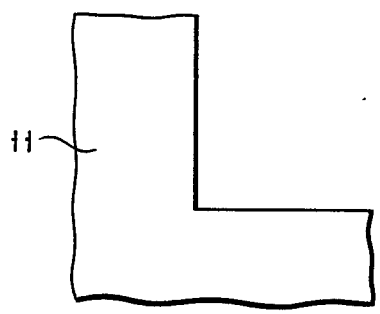
FIGS. 1A to 1C are cross sectional views of thermally oxidized layers formed in the angular portions of the bottom of a groove cut out in the surface of a silicon substrate.
Figure 1B:
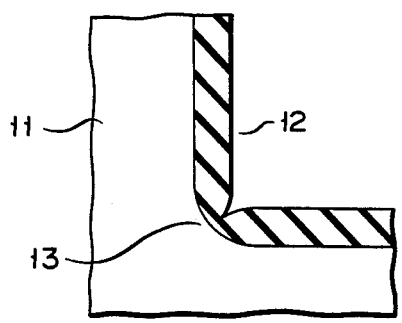
Figure 1C:
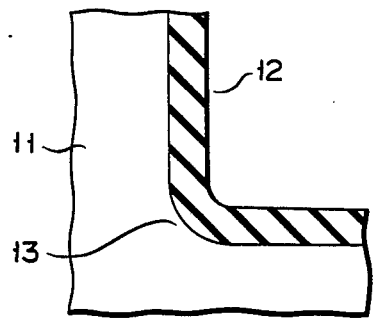

The present inventors surveyed the condition in which a thermally oxidized layer was formed in the angular portions appearing at the top and bottom of a groove cut out in the semiconductor substrate surface. The process ordinarily used in depositing an insulation layer for the MOS capacitor, namely, thermal oxidation in an atmosphere of dry oxygen is characterized in that when the bottom of a groove cut in the silicon substrate 11 (FIG. 1A) is oxidized, a thermally oxidized layer (silicon oxide layer) 12 is formed on the surface of the silicon substrate 11 (FIG. 1B). At this time, the concentration of stresses at the time of oxidation restricts oxidation in the angular portion (FIG. 1B). Consequently, an oxide layer in angular portion 13 is made thinner than that deposited on the flat portion of the groove cut in the semiconductor substrate. Since oxidation in angular portion 13 is restricted, an interface between the Si and SiO$_2$ phases of angular portion 13 has its curvature radius made larger than before oxidation. When, therefore, silicon substrate 11 was thermally oxidized in an oxidizing atmosphere containing steam, thermally oxidized layer 12 was formed with the same thickness in both angular portion 13 and flat portion of the groove cut in the semiconductor substrate surface (FIG. 1C). The occurrence of this satisfactory event is assumed to arise from the fact that addition of steam loosens the concentration of stresses in angular portion 13 during oxidation, thus allowing oxidation to be sufficiently advanced even in angular portion 13. In this case, the curvature radius of the interface between the Si and SiO$_2$ phases in angular portion 13 was enlarged than before oxidation, though not so prominent as in the case of FIG. 1B. In other words, it was found that when the silicon substrate surface was thermally oxidized in an oxidizing atmosphere containing steam, it was possible to prevent a decrease in the thickness of the oxidized layer formed in the angular portion of the bottom of the groove cut in the semiconductor substrate and further to render said angular portion 13 substantially round.

Figure 2A:
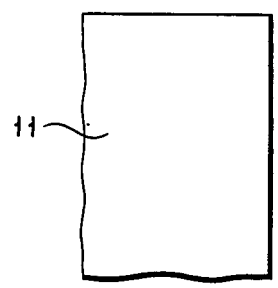
FIGS. 2A to 2C are cross sectional views of thermally oxidized layers provided in the angular portions of the upper side of said groove.
Figure 2B:
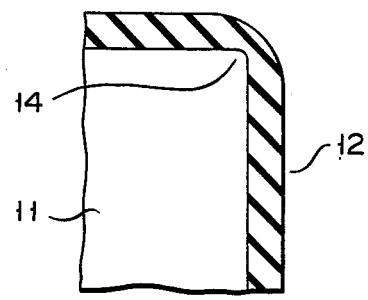
Figure 2C:
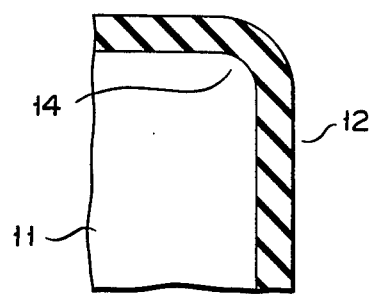

When the upper side of the groove cut in silicon substrate 11 shown in FIG. 2A is thermally oxidized in an atmosphere of dry oxygen, a thermally oxidized layer is formed on the surface of silicon substrate 11 (FIG. 2B). At this time oxidation in angular portion 14 is restricted by the concentration of stresses in said angular portion 14 during oxidation. As a result, the oxidized layer is made thinner in angular portion 14 than in the flat portion of the groove cut in the semiconductor substrate. When silicon substrate 11 was thermally oxidized in an oxidizing atmosphere containing steam, thermally oxidized layer 12 was formed with the same thickness in both angular and flat portions of said groove. The occurrence of this satisfactory event is assumed to arise from the flat that addition of steam loosened the concentration of stresses in angular portion 14 during oxidation, thereby allowing oxidation to sufficiently proceed even in angular portion 14. In the case of FIG. 2C, an interface between the Si and SiO$_2$ phases of angular portion 14 had its curvature radius more enlarged than in the case of FIG. 2B. In other words, thermal oxidation of the surface of the silicon substrate in an oxidizing atmosphere containing steam enabled the oxidized layer deposited in angular portion 14 on the upper side of the groove cut in said silicon substrate had its thickness reduced, thereby rendering said angular portion 14 substantially round.

As mentioned above, the thermal oxidation of the silicon substrate in an oxidizing atmosphere containing steam to deposit an oxidized layer in the silicon substrate surface provided with a groove accelerates oxidation in angular portions 13, 14 at the bottom and top of the groove, thereby preventing the oxidized layer in angular portions 13, 14 from being reduced in thickness, and further ensuring the enlargement of the curvature radius of the interface between the Si and SiO$_2$ phases of the angular portion (perticularly angular portion 14). Referring to angular portion 13, addition of steam renders the curvature radius of the interface between Si and SiO$_2$ phases of said angular portion 13 slightly smaller than absence of steam. Therefore, absence of steam is better than its addition. With respect to a groove cut by anisotropic dry etching, for example, the RIE process, angular portion 13 at the bottom of the groove is generally rendered more round than angular portion 14 on the upper side of the groove. Therefore, it is more necessary to render angular portion 14 on the upper side of the groove sufficiently round than angular portion 13 at the bottom of the groove. In other words, though a slight decline in the curvature radius of angular portion 13 at the bottom of the groove is accompanied with a slight disadvantage, the enlargement of the curvature radius in angular portion 14 on the upper side of the groove prominently elevates the effect of the addition of steam.

It was experimentally found that the content of steam had to be larger than 10 ppm in order to realize the above-mentioned advantageous effect. When, however, the steam content increases over 30% by vol, oxidation tends to be solved down too much, thereby presenting difficulties in fabricating such a thin oxidized layer as that used to insulate a capacitor. Therefore, it was necessary to limit the content of said steam to a range between 20 ppm and 10% by vol.

When the silicon substrate surface was thermally oxidized in an oxidizing atmosphere containing hydrogen chloride instead of steam, the same effect was realized as in the case where the atmosphere contained steam. When the atmosphere contained hydrogen chloride, it was necessary to limit the content of said hydrogen chloride to a range between 20 ppm and 10% by vol for the same reason as that given for the application of steam.

The present invention will become more apparent with reference to the following examples.

Figure 3A:
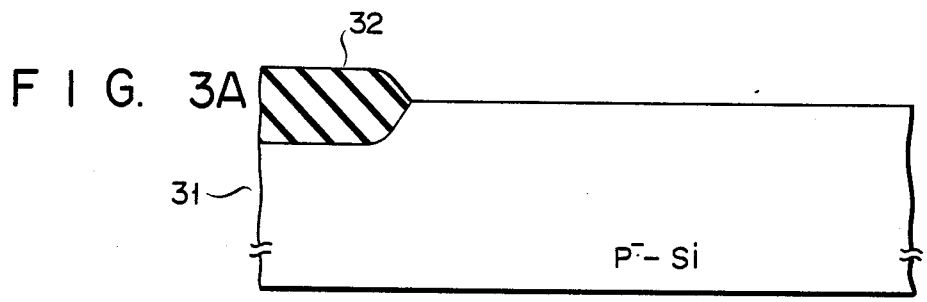

FIGS. 3A to 3E are the cross sectional views showing the sequential steps of manufacturing an MOS capacitor by a method according to a first embodiment of the present invention. First, as indicated in FIG. 3A, field oxide layer 32 was formed with a thickness of about 0.1 to 1 micron on P type silicon substrate 31 having a resistivity of about 10 Ωcm. Said field oxide layer 32 was deposited, for example, by one of the following three methods:

(a) LOCOS process using, for example, a nitride layer as a mask;

(b) a process of forming an oxide layer over the whole surface of P type silicon substrate 31;

(c) previously cutting a groove in a field region and embedding an oxide layer in said groove.

Figure 3B:
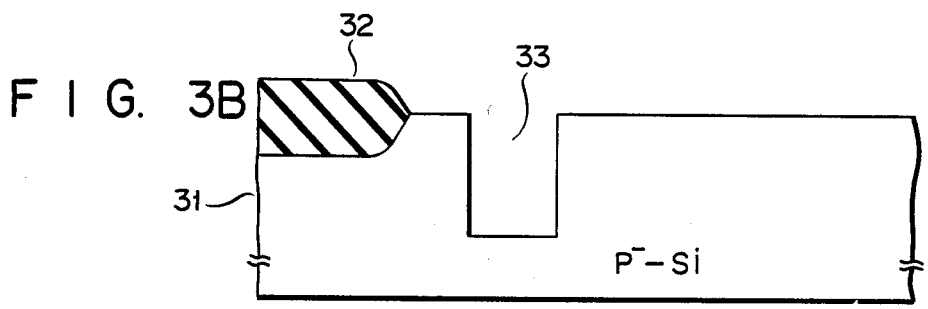

Next, groove 33 was cut in the surface of silicon substrate 31 (FIG. 3B). Said groove 33 was formed by the RIE process involving the application of a gas mainly composed of, for example, CF$_4$, SF$_6$, or CCl$_4$ or any one of these gases containing H. When groove 33 was cut by the RIE process, a mask itself composed of the ordinary photoresist was likely to be etched out. Therefore it was preferred to apply a 3-ply mask involving SiO$_2$/Si$_3$N$_4$/SiO$_2$ which is prepared, for example, by the CVD process.

Figure 3C:
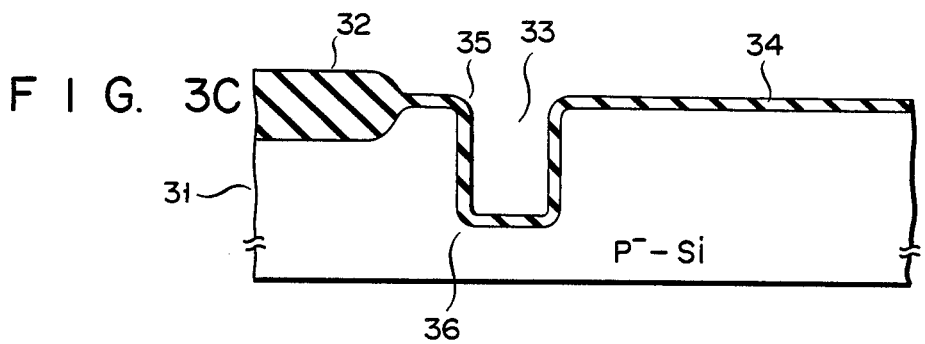

Next as indicated in FIG. 3C, silicon oxide (SiO$_2$) layer 34 acting as a capacitor insulation layer was deposited on the surface of silicon substrate 31 with a thickness of 150 Å by applying thermal oxidation in an argon gas containing 5% by vol of steam at a temperature of 1100° C. for 10 minutes. At this time, silicon oxide layer 34 was deposited with a uniform thickness even in angle portions 35, 36 of groove 33. Further, the curvature radius of an interface between the Si and SiO$_2$ phases of angle portions 35, 36 was made sufficiently larger than before the aforementioned thermal oxidation.

Figure 3D:
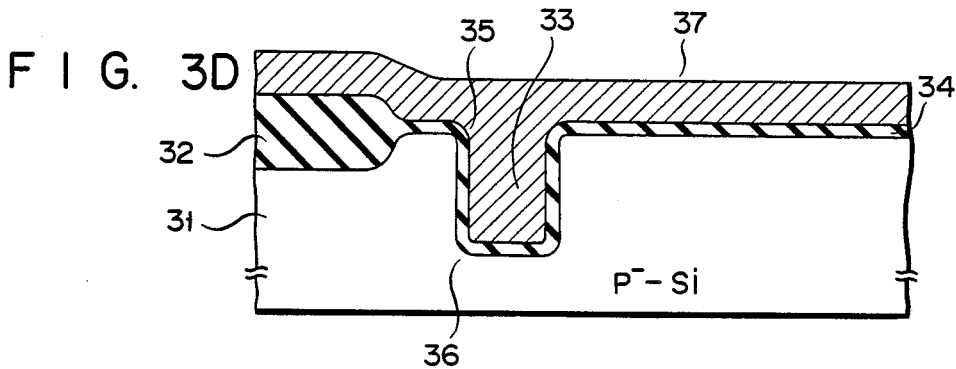

Later as indicated in FIG. 3D, first phosphorus-doped polycrystalline silicon layer 37 acting as a capacitor electrode was deposited with a thickness of about 4000 Å by the LPCVD process. Thereafter, a capacitor electrode was provided by patterning first polycrystalline silicon layer 37 (FIG. 3E), thus completing the fabrication of the MOS capacitor. Further later, gate electrode 39 composed of second polycrystalline layer was deposited on a switching MOS FET region with gate oxide layer 38 interposed therebetween. At this time, n+type source and drain regions 41, 42 were also deposited on the surface of silicon substrate 31, thereby completing dRAM memory cell.

Description may now be made of the effect of the MOS capacitor manufactured by a process according to the above-mentioned first embodiment of the present invention. Comparison was made between the property of the MOS capacitor of the present invention which involved capacitor insulation layer (silicon oxide layer) 34 deposited according to the first embodiment of the invention, one hundred thousand grooves and a common capacitor electrode, and the property of the conventional MOS capacitor having the same construction as that of the present invention, wherein a capacitor insulation layer was deposited in an atmosphere of dry oxygen at a temperature of 1100° C. Said comparison was carried out to determine the leak current (gate voltage Vg-current Ig property) of the present invention and that of the conventional apparatus. FIG. 4 illustrates the results of said comparison, proving that a leak current is far more decreased in the present invention than in the conventional apparatus.

As mentioned above, the present invention is characterized in that at the time of oxidation, the concentration of stresses in angular portions 35, 36 of groove 33 is restricted, thereby enabling capacitor insulation layer (silicon oxide layer) 34 to be deposited with a uniform thickness. Consequently, it is possible to reduce the thickness of capacitor insulation layer 34 and provide a large capacity. Further, if a layer 34 and provide a large capacity. Further, if a highly integrated dRAM is prepared from the MOS capacitor embodying the present invention, it is possible to reduce the malfunction of dRAM due to software error and broaden the operation latitude of a sense amplifier.

The foregoing embodiment refers to the case where thermal oxidation for the preparation of capacitor insulation layer 34 was performed at a temperature of 1100° C. which was subject to most rigid conditions. However, it has been confirmed that capacitor insulation layer 34 can be deposited with a uniform thickness by limiting steam content to a range between 10 ppm and 30% by vol and thereby preventing the concentration of stresses.

Referring to the step shown in FIG. 3C, it has been proved that even if thermal oxidation is undertaken in an oxidizing atmosphere containing hydrogen chloride (HCl) instead of steam, the same satisfactory result can be achieved as in the foregoing embodiment. However, where hydrogen chloride was applied, it was found necessary to limit the content of hydrogen chloride within a range between 20 ppm and 10% by vol. Further where thermal oxidation was carried out in an atmosphere containing both steam any hydrogen chloride the same satisfactory result was achieved as in the above-mentioned embodiment.

FIGS. 5A to 5F are cross sectional views illustrating the sequential steps of manufacturing an MOS capacitor according to a second embodiment of this invention.

First as indicated in FIG. 5A, P type silicon substrate 51 is provided which has a resistivity of 5 to 50 Ωcm and an orientation of (100). An oxide layer is deposited on said substrate 51 with a thickness of about 0.8 micron. The ordinary photoetching is applied to remove the oxide layer deposited on an lement-forming region, and the retained oxide layer is used as mask 52. Later as indicated in FIG. 5B, silicon substrate 51 is subjected to vertical 2-micron anisotropic etching through make 52 by RIE process to provide groove 53.

After removing mask 52, corners 55, 56 of groove 53 are rendered round by the method of this invention. Namely, as illustrated in FIG. 5C, silicon substrate 51 is thermally oxidized in an oxidizing atmosphere containing 10% by vol of steam at a temperature of 950° C. for 30 minutes, thereby depositing oxide layer 54 on the surface of substrate 51 with a thickness of 100 to 500 Å. The above-mentioned step may be replaced by the step of depositing thermally oxidized layer 54 on the surface of substrate 51 by thermally oxidizing silicon substrate 51 in an oxidizing atmosphere containing a gaseous mass containing chlorine of 50 ppm, for example, hydrogen chloride at a temperature of 800° C. for 30 minutes. The chlorine-containing gaseous mass may be provided by not only HCl, but also, for example, $Cl_2$, trichloroethylene, thrichloroethane. Further, in the above-mentioned case, it is possible to apply an oxidizing atmosphere containing a fluoride, for example, $NF_3$, or to use a mixture of said fluoride and chlorine-base gas. Later as shown in FIG. 5D, thermally oxidized layer is removed. Under this condition, the curvature radius in angular portions 55, 56 in groove 53 cut in silicon substrate 51 is sufficiently enlarged to render angular portions 55, 56 satisfactorily round.

Next as seen from FIG. 5E, silicon oxide layer ($SiO_2$) 57 acting as a capacitor insulating layer is deposited on the surface of silicon substrate 51 by the customary process, that is, thermal oxidation, for example, in an atmosphere of dry oxygen at a temperature of 1000° C. for 10 minutes. Since the curvature radius in angular portions 55, 56 of groove 53 is fully enlarged, said silicon oxide layer 57 can be deposited on the surface of silicon substrate 51 without being reduced in thickness even in said angular portions 55, 56. Thermal oxidation may be performed in an oxidizing atmosphere containing steam, or chlorine or fluorine (for example $NF_3$) in the deposition of thermally oxidized layer 54 to provide the capacitor-insulating layer.

Finally as illustrated, in FIG. 5F, phosphorus-doped polycrystalline silicon layer is deposited on silicon oxide layer 57, and said polycrystalline layer is patterned to form a capacitor electrode 58, thereby completing an MOS capacitor.

The above-mentioned embodiment of the present invention can render angular portions 55, 56 of groove 53 substantially round, preventing said angular portions 55, 56 from being thinned and suppressing the concentration of an electric field in said angular portions 55, 56 and consequently elevating the reliability of the subject MOS capacitor.

When an oxidizing atmosphere containing fluorine is applied, oxidation can be performed at a lower temperature than in the case where an oxidizing atmosphere involving steam is used.

Description may now be made with reference to $NF_3$ gas of the reason why the application of an oxidizing atmosphere containing chlorine or fluorine can effect oxidation which gives rise to the rounded angular portions in the corners of the groove formed in the semiconductor substrate. When $NF_3$ gas is added to an oxidizing atmosphere. $NF_3$ is thermally dissociated on the surface of a silicon layer to provide fluorine-base radicals such as NF, $NF_2$, F or $F_2$. The fluorine atom has a higher electronegativity than silicon, and consequently the bonding energy of the Si-F bond is greater than that of the Si-Si bond. Therefore, the arrival of a fluorine compound gives rise to the formation of an Si-F bond and the dangling bond of Si on the surface of Si. In the dangling bond silicon is ready to combine with oxygen. Since F involved in the Si-F bond has a higher electronegativity than silicon, the silicon atom constitutes an ionic bond having a positive electric charge. Consequently, the silicon atom is easily combined with an oxygen atom having a negative ion. The deposition of fluorine on the surface of silicon enables silicon to be more readily oxidized, and accelerates the average interface reaction speed during said oxidation.

When the surface of a silicon layer is oxidized in an atmosphere of dry oxygen containing 100 ppm of $NF_3$ at a temperature of, for example, 700° C., linear rate constant B/A and parabolic rate constant B are respectively indicated as $2.6 \times 10^{-2}$ μm/h and $4.9 \times 10^{-4}$ μm $^2$/h. When oxidation is carried out in an atmosphere of dry oxygen held at the same temperature as described above, the following formulas result:

$$B/A = 2.6 \times 10^{31\ 4}\ \mu m/h$$

$$B = 3.6 \times 10^{31\ 4}\ \mu m^2/h$$

As seen from the above formulas, therefore, B/A indicates a value $10^2$ larger than in the case where $NF_3$ is added. This shows that the addition of $NF_3$ causes the value of A applicable as a guide for determining transfer from the region of reaction control case to the region of diffusion control case to be decreased from 1.4 μm to 190 Å.

In other words, when oxidation is undertaken in an atmosphere of dry oxygen containing $NF_3$, oxidation governed by the diffusion velocity controlling factor starts from a layer formed with a smaller thickness than in the case where oxidation takes place in an atmosphere of dry oxygen.

Therefore, the deposition of fluorine on the corners of, for example, projections gives rise to oxidation governed by the diffusion velocity controlling factor earlier than in the case where no fluorine compound is added, though an oxidized layer is deposited in said corners with a smaller thickness than in the other flat portions due to the action of stresses. As a result, the oxidized layer can be formed even in the corner portions substantially as uniformly as in the flat portions. Further since oxidation governed by the diffusion velocity controlling factor is conversely restricted in the corner portions of the groove, the interface between the Si and $SiO_2$ phases is assumed to bear a rounded shape.

FIGS. 6A to 6G are cross sectional views showing the sequential steps of manufacturing an MOS capacitor by a method according to a third embodiment of the present invention.

Figure 6A:
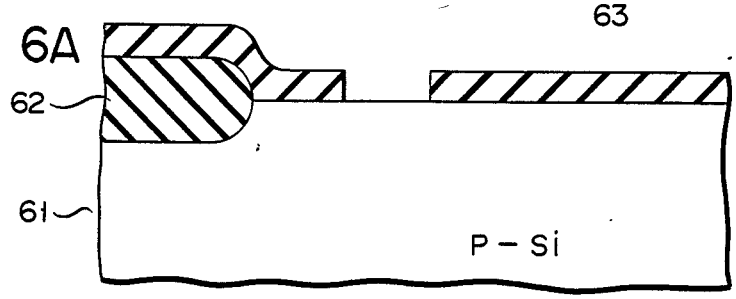
FIGS. 6A to 6G are cross sectional views indicating the sequential steps of manufacturing an MOS capacitor by a method according to a third embodiment of the invention.

First as shown in FIG. 6A, P type silicon substrate 61 was provided which had a relative resistivity of 5 to 50

Figure 6B:
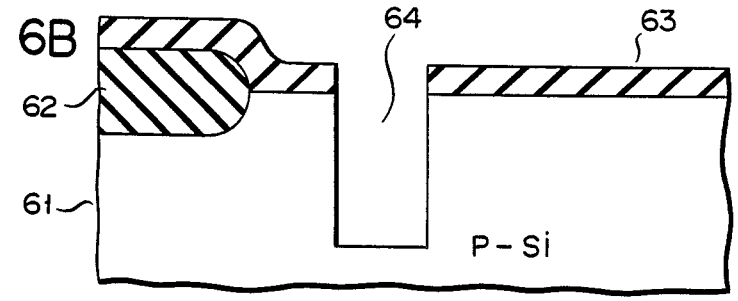
Figure 6C:
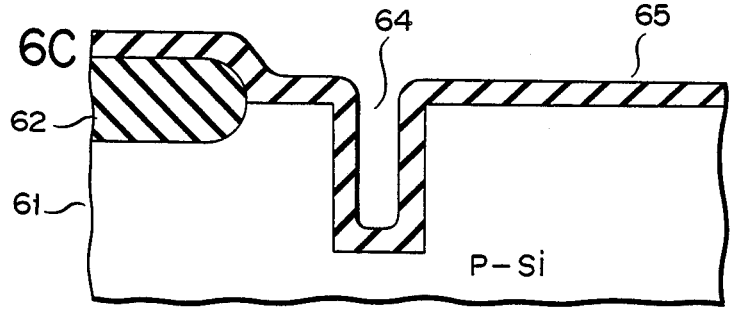

Ωcm and a planar orientation of (100). After field oxide layer 62 was deposited on part of said P type silicon substrate 61, oxide layer 63 was formed over the whole surface with a thickness of 0.8 μm by the CVD process. Then a window was formed in the capacitor-forming region by the ordinary photoetching process. Groove 64 having a vertical wall was cut with a depth of about 2 microns by the RIE process with CVD oxide layer 62 used as a mask (FIG. 6B). After removing oxide layer 63, oxide layer 65 was deposited by the CVD process (FIG. 6C) preferably with a greater thickness than 200 Å.

Figure 6D:
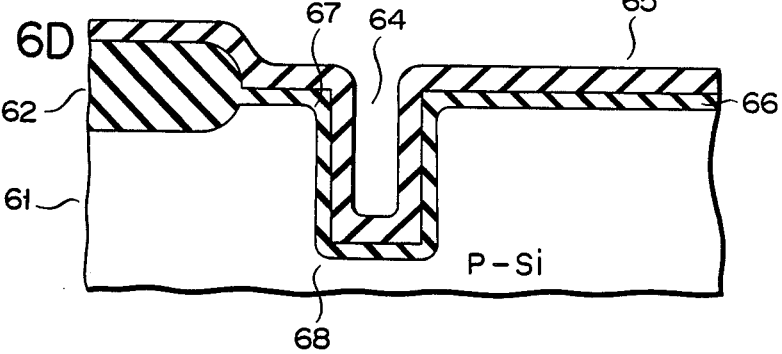

Thermal oxidation was applied to the deposited CVD oxide layer 65 to form an oxide layer 66 on that part of the surface of silicon substrate 61 which underlay CVD layer 65 (FIG. 6D). Said thermal oxidation was carried out in an oxidizing atmosphere containing 5% by vol of steam at a temperature of 1000° C. for 30 minutes. As a result, the curvature radius of the interface between the Si and $SiO_2$ phases of angular portions 67, 68 of groove 64 was sufficiently enlarged. In this case, thermally oxidized layer 66 was formed preferably with a greater thickness than 100 Å.

Figure 6E:
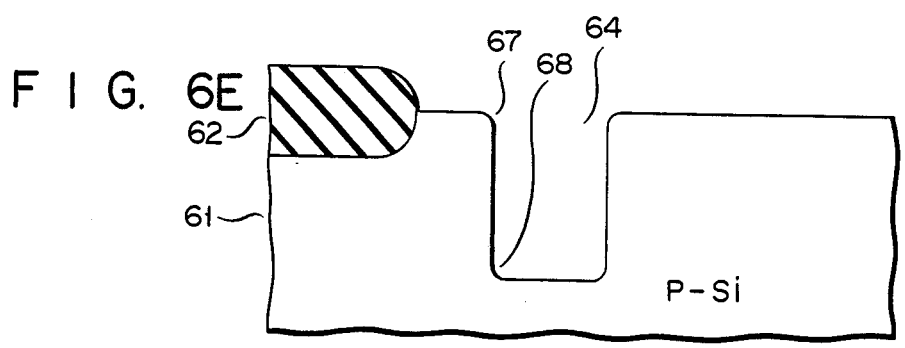
Figure 6F:
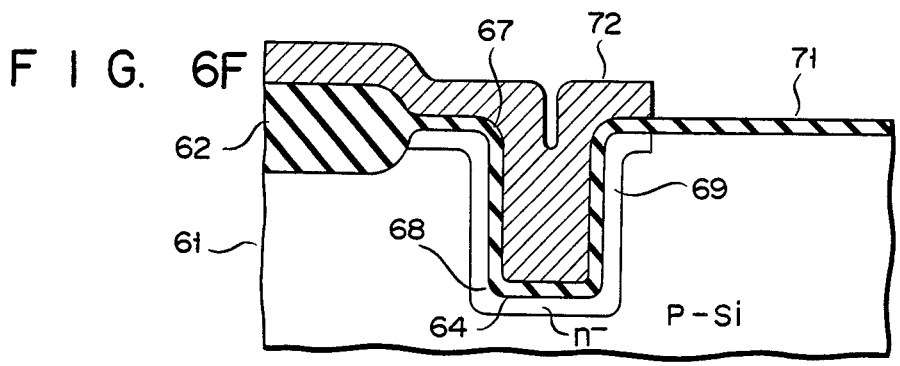

Later as indicated in FIG. 6E, CVD oxide layer 65 and thermally oxidized layer 66 were etched off. $n^-$ layer 69 was deposited on the exposed portion of the surface of silicon substrate 61 (FIG. 6F). Silicon oxide layer 71 acting as a capacitor insulation layer was deposited again by thermal oxidation with a thickness of 250 Å. Later a first polycrystalline silicon layer was deposited, and then patterned to provide a capacitor electrode 72.

Figure 6G:
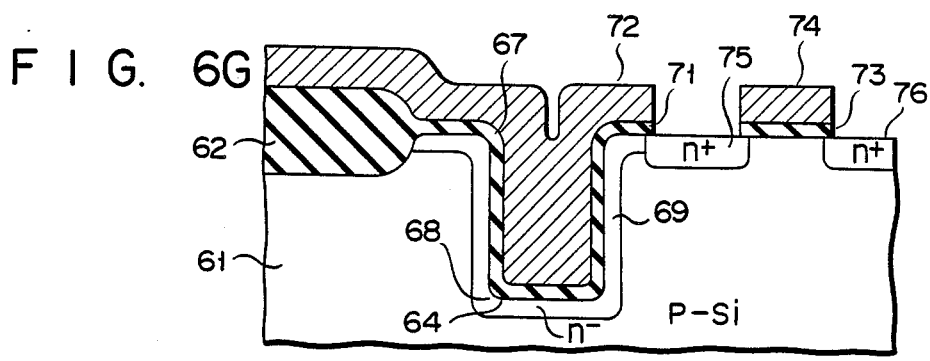

Finally an MOS capacitor was completed in groove 64. Thereafter as illustrated in FIG. 6G, gate oxide layer 75 and gate electrode 74 were formed, and $n^+$ layers 75, 76 acting as source and drain regions were provided, thus finishing dRAM consisting of one transistor and one capacitor.

As can be inferred from the foregoing description, the method of the present invention for manufacturing an MOS capacitor offers the advantages that angular portions 67, 68 of groove 64 cut by, for example, the RIE process can be effectively rounded, thereby preventing angular portions 67, 68 of the thermally oxidized layer acting as capacitor insulation layer 71 from being reduced in thickness, thereby suppressing the concentration of an electric field and consequently providing a highly reliable MOS capacitor.

It will be noted that the present invention is not limited to the aforementioned examples. For instance, when the silicon substrate is thermally oxidized it is possible to dilute a steam-containing atmosphere by not only argon but also, for example, hilium or nitrogen. It is also possible to apply dry oxygen as an atmosphere for thermal oxidation. The dry oxygen acts as a factor for defining the speed of oxidation, thereby facilitating the control of the oxidation rate. The present invention is particularly effective when the angular portion has a curvature radius smaller than 0.1 μm. However, even if the curvature radius is larger than this level, the present invention can be expected to loosen the concentration of stresses. The foregoing description referred to the case where an MOS capacitor was formed on the surface of a single crystal silicon substrate. However, the present invention is also applicable when a similar MOS capacitor is mounted on an SOS substrate constructed by depositing a single crystal silicon layer on an sapphire element or an SOI substrate obtained by depositing a single crystal silicon layer on an insulation layer. Further, the present invention is applicable when a similar MOS capacitor is formed on a polycrystalline silicon layer. The capacitor electrode can be prepared not only from a polycrystalline silicon layer, but also a metal electrode fabricated by the CVD process, or any other material provided with a satisfactory step coverage. Moreover, the present invention is also useful when an LPCVD process $Si_3N_4$ layer is superposed on the thermally oxidized layer obtained in the above-mentioned embodiment to oxidize the surface of said $Si_3N_4$ layer, namely when the so-called 3-ply MOS capacitor is manufactured. In short, the present invention can be applied with various modifications without departing from its scope and object.

What is claimed is:

1. A method of manufacturing an MOS capacitor comprising the steps of:
    forming a groove in the surface of a silicon substrate;
    forming an oxide layer on said surface by thermally oxidizing said surface in an oxidizing atmosphere which contains at least one of the groups consisting of steam, chlorine and fluorine; when the atmosphere contains steam, the proportion of said steam ranges between 10 ppm and 30% by vol, and when the atmosphere contains chlorine and/or fluorine, the total proportion of chlorine and/or fluorine ranges between 20 ppm and 10% by vol, whereby a substantially uniform oxide layer is formed on the surface of said groove, including its angular portions;
    and then fabricating a capacitor electrode on the oxide layer.

2. The method according to claim 1, wherein an oxidizing atmosphere for forming said oxide layer composed steam diluted with at least one of the groups consisting of dry oxygen, argon, helium and nitrogen.

3. The method according to claim 1, wherein the oxide layer is deposited at a temperature ranging from 800° to 1100° C.

4. The method according to claim 1, wherein said oxide layer is formed with a thickness ranging between 100° and 500°.

5. The method according to claim 1, wherein said groove is formed by the anisotropic dry etching process.

6. The method of claim 1 wherein the oxidizing atmosphere contains chlorine and/or fluorine.

7. A method of manufacturing an MOS capacitor which comprises the steps of:
    forming a groove in the surface of a silicon substrate;
    forming an oxide layer on said surface by thermally oxidizing said surface in an oxidizing atmosphere which contains at least one of the groups consisting of steam, chlorine and fluorine; when the atmosphere contains steam, the proportion of said steam ranges between 10 ppm and 30% by vol, and when the atmosphere contains chlorine and/or fluorine, the total proportion of chlorine and/or fluorine ranges between 20 ppm and 10% by vol, whereby a substantially uniform oxide layer is formed on the surface of said groove, including its angular portions;
    removing said thermally oxidized layer;
    forming a capacitor-insulating layer on the surface of said silicon substrate; and
    forming a capacitor electrode on said capacitor-insulating layer.

8. The method of manufacturing an MOS capacitor according to claim 7, wherein said oxidizing atmosphere comprises stream diluted with at least one of the groups consisting of dry oxygen, argon, helium and nitrogen.

9. The method of manufacturing an MOS capacitor according to claim 7, wherein said oxide layer is deposited at a temperature ranging between 800° and 1000° C.

10. The method of manufacturing an MOS capacitor according to claim 7, wherein said thermally oxidized layer is deposited with a thickness greater than 100 Å, and said capacitor-insulating layer is formed with a thickness ranging between 100 and 500 Å.

11. The method of manufacturing an MOS capacitor according to claim 7, wherein said groove is formed by anisotropic dry etching.

12. The method of manufacturing an MOS capacitor according to claim 7, wherein the capacitor-insulating layer is formed by thermally oxidizing said silicon substrate in an atmosphere of dry oxygen.

13. The method of manufacturing an MOS capacitor according to claim 7, wherein the formation of said thermally oxidized layer is preceded by the step of forming a CVD oxidized layer on the surface of said silicon substrate.

14. The method of claim 7 wherein the oxidizing atmosphere contains chlorine and/or fluorine.

* * * * *